US009812639B2

(12) United States Patent
Matsuo et al.

(10) Patent No.: US 9,812,639 B2
(45) Date of Patent: Nov. 7, 2017

(54) NON-VOLATILE MEMORY DEVICE (71) Applicant: Toshiba Memory Corporation, Minato-ku (JP)

(72) Inventors: Koji Matsuo, Ama (JP); Yoshiaki Asao, Yokkaichi (JP); Kunifumi Suzuki, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/559,195

(22) Filed: Dec. 3, 2014

(65) Prior Publication Data
US 2016/0072061 A1 Mar. 10, 2016

Related U.S. Application Data (60) Provisional application No. 62/048,405, filed on Sep. 10, 2014.

(51) Int. Cl.
*H01L 45/00* (2006.01)
*H01L 27/24* (2006.01)

(52) U.S. Cl.
CPC ...... *H01L 45/1233* (2013.01); *H01L 27/2409* (2013.01); *H01L 27/2481* (2013.01); *H01L 45/06* (2013.01); *H01L 45/144* (2013.01)

(58) Field of Classification Search
CPC ... H01L 27/2481; H01L 45/144; H01L 45/06; H01L 45/1233; H01L 27/2409
USPC .......................................................... 257/4
See application file for complete search history.

(56) References Cited

U.S. PATENT DOCUMENTS

| | | | | |
|---|---|---|---|---|
| 5,363,329 A | * | 11/1994 | Troyan | H01L 29/8615 257/2 |
| 8,120,951 B2 | * | 2/2012 | Mouli | G11C 11/5664 257/4 |
| 8,456,900 B2 | * | 6/2013 | Lee | G11C 13/0007 711/154 |
| 2003/0053332 A1 | | 3/2003 | Kleveland et al. | |
| 2007/0285969 A1 | | 12/2007 | Toda et al. | |
| 2007/0285970 A1 | | 12/2007 | Toda et al. | |
| 2007/0285971 A1 | | 12/2007 | Toda et al. | |
| 2008/0273363 A1 | * | 11/2008 | Mouli | G11C 13/0002 365/51 |
| 2009/0289251 A1 | * | 11/2009 | Kiyotoshi | H01L 27/1021 257/43 |

(Continued)

FOREIGN PATENT DOCUMENTS

JP 2002-246561 8/2002
JP 2013-55257 3/2013
WO WO 2010/050117 A1 5/2010

OTHER PUBLICATIONS

R. E. Simpson, et al. "Interfacial phase-change memory", Nature Nanotechnology Letters, 10.1038/NNANO.2011.96, 2011, 5 pages.

*Primary Examiner* — Jarrett Stark
*Assistant Examiner* — Charles N Ausar-El
(74) *Attorney, Agent, or Firm* — Oblon, McClelland, Maier & Neustadt, L.L.P.

(57) ABSTRACT

According to an embodiment, a non-volatile memory device includes a first interconnection, a second interconnection closest to the first interconnection in a first direction, rectifying portions arranged in the first direction between the first interconnection and the second interconnection, and a first resistance change portion arranged between adjacent ones of the rectifying portions in the first direction. Each of the rectifying portions includes a first metal oxide layer and a second metal oxide layer.

18 Claims, 8 Drawing Sheets

(56) References Cited

U.S. PATENT DOCUMENTS

| | | |
|---|---|---|
| 2010/0200828 A1 | 8/2010 | Tominaga et al. |
| 2010/0315867 A1 | 12/2010 | Aizawa et al. |
| 2011/0001112 A1 | 1/2011 | Kiyotoshi |
| 2011/0315942 A1 | 12/2011 | Tominaga et al. |
| 2013/0010530 A1* | 1/2013 | Katayama .......... G11C 13/0007 365/148 |
| 2013/0128654 A1* | 5/2013 | Yoneda .................... H01L 45/00 365/148 |
| 2013/0228737 A1* | 9/2013 | Fukumizu ............... H01L 45/08 257/4 |
| 2013/0256623 A1* | 10/2013 | Kim .................... H01L 45/1233 257/4 |
| 2013/0279247 A1 | 10/2013 | Tominaga et al. |
| 2014/0151622 A1* | 6/2014 | Oyanagi ............. H01L 45/1233 257/2 |
| 2014/0217598 A1* | 8/2014 | Noda ................ H01L 21/76838 257/773 |
| 2014/0284535 A1* | 9/2014 | Saitoh ................. H01L 27/2436 257/2 |
| 2014/0332748 A1* | 11/2014 | Khoueir .............. H01L 27/2481 257/4 |
| 2014/0376307 A1* | 12/2014 | Shintani ............. G11C 13/0004 365/163 |
| 2015/0028280 A1* | 1/2015 | Sciarrillo ................ H01L 45/04 257/4 |
| 2015/0041751 A1* | 2/2015 | Zhang .................... H01L 29/47 257/4 |
| 2016/0064666 A1* | 3/2016 | Chan .................... H01L 45/145 257/4 |
| 2017/0186816 A1* | 6/2017 | Sciarrillo ............ H01L 27/2481 |

* cited by examiner

NON-VOLATILE MEMORY DEVICE

CROSS-REFERENCE TO RELATED APPLICATIONS

This application is based upon and claims the benefit of priority from U.S. Provisional Patent Application 62/048,405 filed on Sep. 10, 2014; the entire contents of which are incorporated herein by reference.

FIELD

Embodiments are generally related to a non-volatile memory device.

BACKGROUND

A cross-point memory device having a three-dimensional structure has been developed. The cross-point memory device may easily achieve high integration, and provide a high-speed operation by using a resistance change material for the memory cell thereof. For example, such a memory cell has a structure combining a memory element and a rectifying element. The memory element contains a resistance change material, and is connected in series to the rectifier element.

The rectifying element acts to avoid data reading from an unselected memory cell and data writing thereto among plural memory cells that are connected in parallel. Thus, the rectifying element may preferably have a high ratio of a forward current to a backward current (ON/OFF ratio). For example, a p-n junction diode using silicon as a material has a high ON/OFF ratio.

Although the silicon diode is easily manufactured, the manufacturing process of the silicon diode may include a step with a thermal treatment of 800° C. or higher, deteriorating the characteristics of the resistance change material in some cases. In addition, there is a limit to reducing the size of the silicon diode, thus becoming an obstacle to miniaturize the memory cell. Hence, a rectifying element is required that has a high ON/OFF ratio and is easily miniaturized without deterioration of the resistance change material, and a memory cell structure suitable therefor is also required.

BRIEF DESCRIPTION OF THE DRAWINGS

FIGS. 7A to 8B are exemplary cross-sectional views schematically showing memory cells according to a variation of the embodiment.

DETAILED DESCRIPTION

According to an embodiment, a non-volatile memory device includes a first interconnection, a second interconnection closest to the first interconnection in a first direction, rectifying portions arranged in the first direction between the first interconnection and the second interconnection, and a first resistance change portion arranged between adjacent ones of the rectifying portions in the first direction. Each of the rectifying portions includes a first metal oxide layer and a second metal oxide layer.

Hereinafter, embodiments will be described with reference to the drawings. In the drawings, the same reference numerals are given to the same portions and detailed description thereof is appropriately omitted and only the different parts are described. In addition, the drawings are schematic or conceptual, a relationship between a thickness and a width of each portion, a ratio of a size between the portions or the like may not necessarily be the same as the actual ones. Furthermore, even when indicating the same portion, in some cases, each dimension and ratio may be different depending on the drawings.

The arrangement of each component will be described using X-, Y- and Z-axial directions in the drawings in some cases. An X-axis, a Y-axis, and a Z-axis are perpendicular to one another and respectively indicate an X-direction, a Y-direction, and a Z-direction. In addition, the Z-direction is expressed as an upper side and the opposite side thereof is expressed as a lower side in some cases.

Figure 1A:
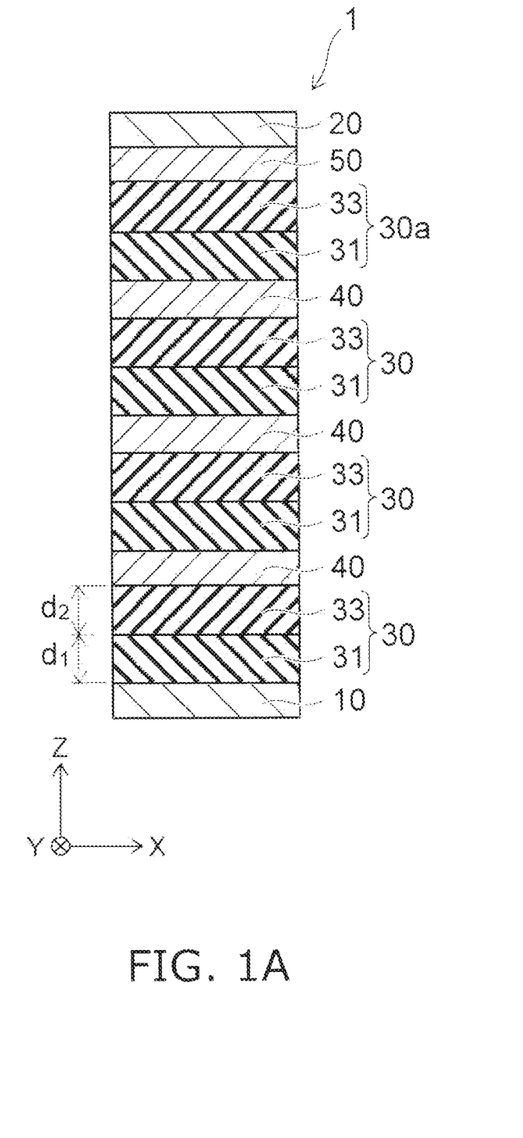
FIGS. 1A and 1B are an exemplary cross-sectional view and an equivalent circuit schematically showing a memory cell of a non-volatile memory device according to an embodiment.
Figure 1B:
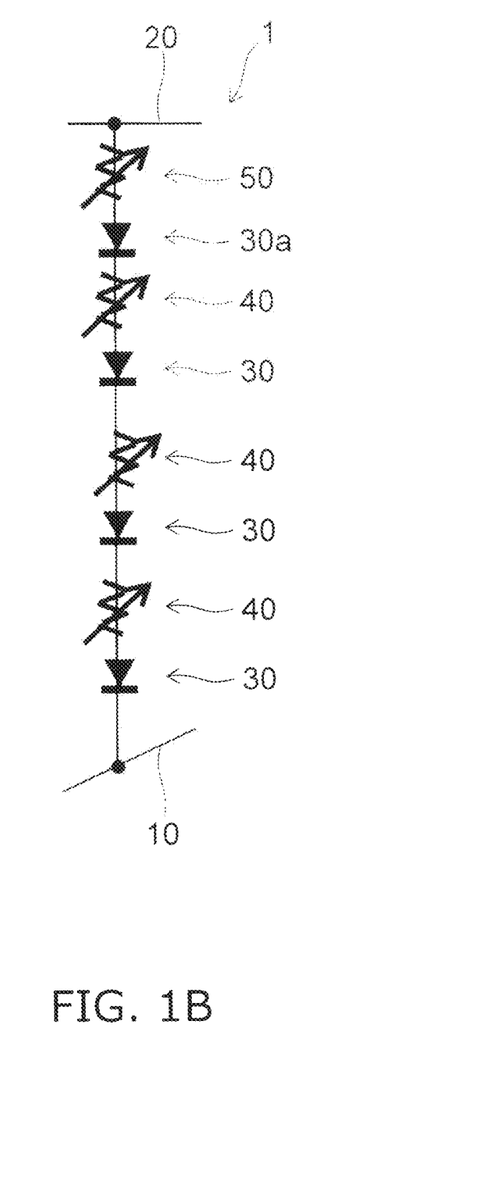

FIGS. 1A and 1B are a schematic cross-sectional view and an equivalent circuit illustrating a memory cell 1 of a non-volatile memory device according to an embodiment. FIG. 1A is the schematic cross-sectional view showing the memory cell 1. FIG. 1B is the equivalent circuit of the memory cell 1.

The non-volatile memory device according to the embodiment includes, for example, a cross-point type memory cell array. As shown in FIG. 1A, the memory cell 1 includes a first interconnection 10, a second interconnection 20, rectifying portions 30, and a plurality of first resistance change portions 40.

One of the first interconnection 10 and the second interconnection 20 is a word line and the other is a bit line. The second interconnection 20 is an interconnection closest to the first interconnection 10 in a first direction (hereinafter, referred to as a Z-direction). For example, the first interconnection 10 extends in a Y-direction and the second interconnection 20 extends in an X-direction.

The rectifying portions 30 are aligned in the Z-direction between the first interconnection 10 and the second interconnection 20. Each of the rectifying portions 30 includes a first metal oxide layer 31 and a second metal oxide layer 33. The second metal oxide layer 33 is stacked on the first metal oxide layer 31 in the Z-direction.

For example, the energy band gap of the first metal oxide layer 31 is larger than the energy band gap of the second metal oxide layer 33. In addition, the thickness $d_1$ of the first metal oxide layer 31 in the Z-direction is thinner than the thickness $d_2$ of the second metal oxide layer 33 in the Z-direction. The dielectric constant of the second metal oxide layer 33 is higher than the dielectric constant of the first metal oxide layer 31.

Each of the first resistance change portions 40 is provided between the rectifying portions 30 adjacent in the Z-direction. The first resistance change portion 40 changes a state thereof reversibly from a first state to a second state by heat, for example. For example, the resistance value in the first state is higher than the resistance value in the second state.

The memory cell 1 further includes a second resistance change portion 50. The second resistance change portion 50 is provided between a rectifying portion 30a and the second interconnection 20. The rectifying portion 30a is positioned at the end close to the second interconnection 20 among the plural rectifying portions 30 aligned in the Z-direction. For example, the second resistance change portion 50 is formed of the same material as the first resistance change portion 40. The second resistance change portion 50 changes a state thereof from the first state to the second state by heat, for example. In addition, the memory cell 1 may have a structure without the second resistance change portion 50.

As shown in FIG. 1A, the memory cell 1 includes the rectifying portions 30 (for example, diodes) arranged in series, the first resistance change portions 40, and the second resistance change portion 50 between the first interconnection 10 and the second interconnection 20. The rectifying portion 30 and the first resistance change portion 40 are alternately arranged in the Z-direction.

For example, the first metal oxide layer 31 and the second metal oxide layer 33 included in the rectifying portion 30 can be formed at a temperature of 600° C. or lower using a sputtering method or an atomic layer deposition (ALD) method. Accordingly, when the rectifying portion 30 is formed, it is possible to avoid the deterioration of the first resistance change portion 40. That is, by using the stacked structure of the first metal oxide layer 31 and the second metal oxide layer 33 as the rectifying portion 30, the rectifying portion 30 and the first resistance change portion 40 can be alternately stacked, maintaining the characteristic of the first resistance change portion 40.

Figure 2A:
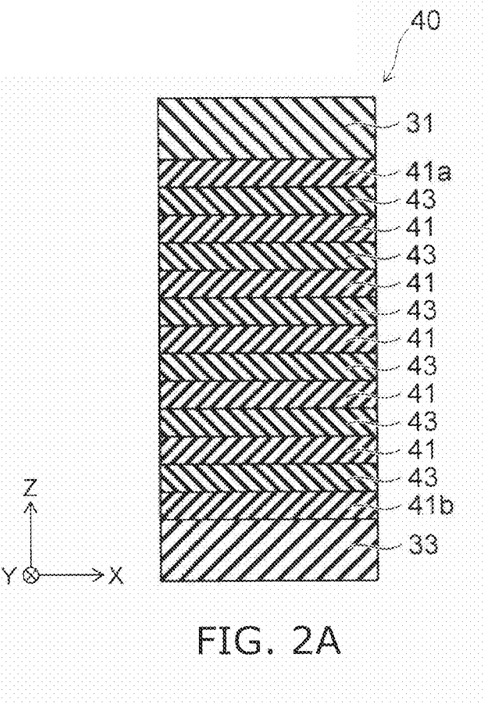
FIGS. 2A to 2C are exemplary views schematically showing a resistance change portion of the non-volatile memory device according to the embodiment.
Figure 2B:
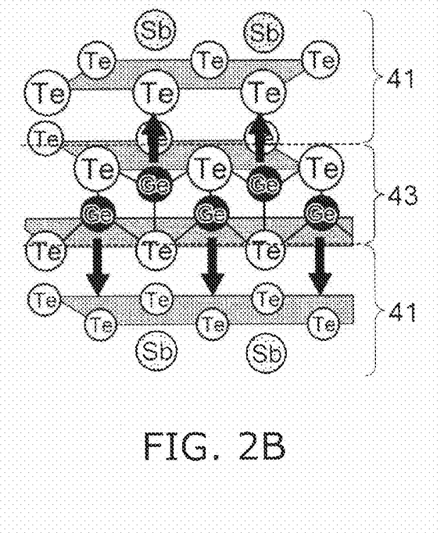
Figure 2C:
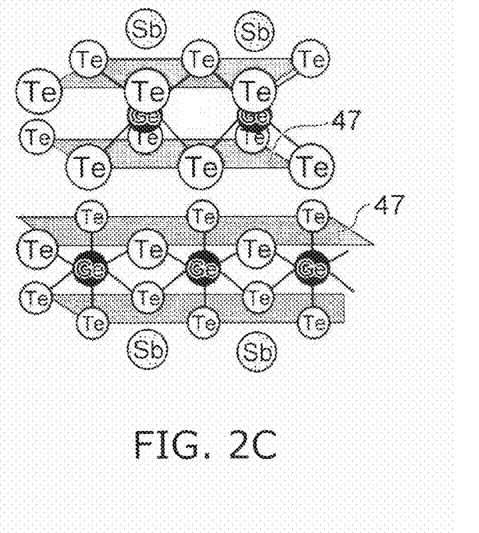

Next, the first resistance change portion 40 will be described with reference to FIGS. 2A to 2C. FIG. 2A is a schematic cross-sectional view illustrating the first resistance change portion 40. FIGS. 2B and 2C are schematic views showing the crystal structures of the first resistance change portion 40.

The first resistance change portion 40 includes first portions 41 and at least one second portion 43. As shown in FIG. 2A, the first portions 41 are aligned in the Z-direction. The second portion 43 is provided between the first portions 41 adjacent in the Z-direction. The stacked number of the first portions 41 is arbitrary and the first resistance change portion 40 has at least two first portions 41. That is, the minimum unit of the first resistance change portion 40 includes two first portions 41 and the second portion 43 arranged therebetween.

FIGS. 2B and 2C are schematic views of the minimum unit illustrating exemplary atomic arrangements in the first resistance change portion 40. FIG. 2B shows a first state (high resistance state) and FIG. 2C shows a second state (low resistance state).

As shown in FIG. 2B, the first portion 41 contains antimony (Sb) and tellurium (Te). The second portion 43 contains germanium (Ge) and tellurium (Te). For example, in the process of stacking the first resistance change portion 40, $Sb_2Te_3$ is formed as the first portion 41. GeTe is formed as the second portion 43. The first portion 41 contains a chalcogenide compound having a hexagonal crystal structure, for example, in which an antimony atom and a tellurium atom are arranged with a ratio of 2:3. The second portion 43 contains a chalcogenide compound having a cubic crystal structure, for example, in which a germanium atom and a tellurium atom are arranged with a ratio of 1:1.

As indicated by an arrow in FIG. 2B, when the first resistance change portion 40 is heated, the germanium atom in the second portion 43 moves toward the first portion 41. The atomic arrangement of the first resistance change portion 40 is changed to the arrangement shown in FIG. 2C.

In the crystal structure shown in FIG. 2C, the germanium atom has a coordination number of 6 and is bonded to the tellurium atom. As a result, atomic planes 47 facing each other without interatomic bonding are formed in the second portion 43. In contrast, the arrangement of the antimony atom and the tellurium atom is maintained in the first portion 41.

In the first state shown in FIG. 2B, the coordination number of germanium atom is 4. In the second state after the phase change, the coordination number of a germanium atom is changed to 6. As a result, the first resistance change portion 40 changes the state thereof as being shifted from a high resistance state to a low resistance state.

In this manner, predetermined energy, for example, heat is applied to the first resistance change portion 40 to cause the phase change, and thus the state of the first resistance change portion 40 is shifted from the first state to the second state. Further, by applying predetermined energy, the state of the first resistance change portion 40 can be shifted from the second state to the first state.

The state of the first resistance change portion 40 is reversibly shifted between the first state and the second state by forcing to move only the germanium atoms. Therefore, it is possible to realize a memory cell with lower power consumption compared to a phase change material accompanied with a wider change in the crystal structure. In addition, there is little change in the crystal volume before and after the phase change, thus improving the resistance against the data rewriting.

Further, as shown in FIGS. 2B and 2C, the arrangement between the antimony atom and the tellurium atom in the first portion 41 is maintained through the phase change process. That is, the crystal structure of $Sb_2Te_3$ is maintained. $Sb_2Te_3$ has a higher conductivity than GeTe. For example, in the first state, the first portion 41 has a higher conductivity than the second portion 43, and the conductivity of the first portion 41 is also maintained in the second state.

As described above, the first portion 41 is a conductor and the conductivity is not changed throughout the phase change process. Therefore, the first portion 41 may serve as a contact layer with respect to the rectifying portion 30. For example, a first portion 41a or 41b, which is positioned at an end in the arrangement of the first portions 41, is in contact with any one of the first metal oxide layer 31 and the second metal oxide layer 33 in the rectifying portion 30.

In the example shown in FIG. 2A, the first portion 41a is in contact with the first metal oxide layer 31. The first portion 41b is in contact with the second metal oxide layer 33. The first portion 41a is positioned at the end close to the second interconnection 20 among the first portions 41 arranged in the Z-direction. The first portion 41b is positioned at the end close to the first interconnection 10 among the first portions 41 arranged in the Z-direction.

Figure 3A:
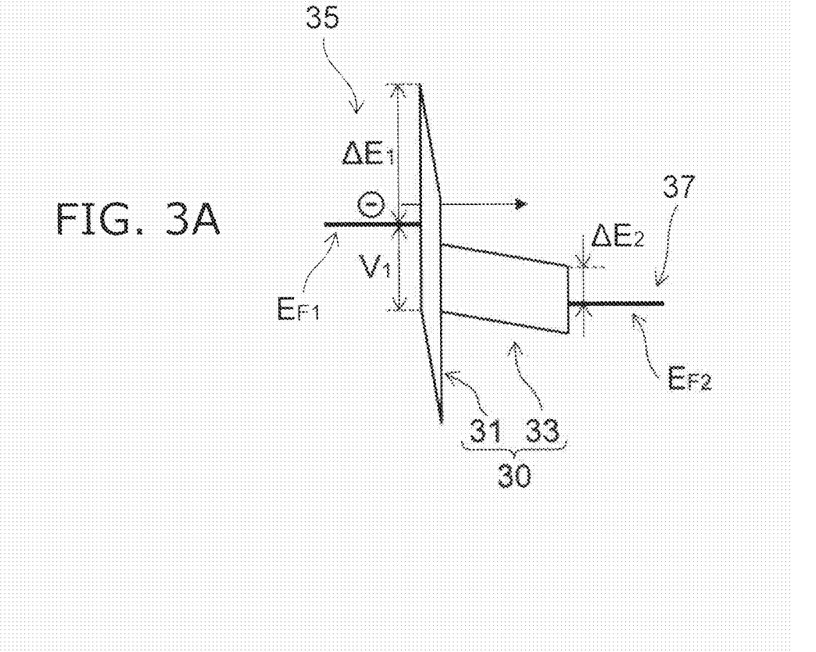
FIGS. 3A and 3B are exemplary energy band diagrams showing a rectifying portion of the non-volatile memory device according to the embodiment.
Figure 3B:
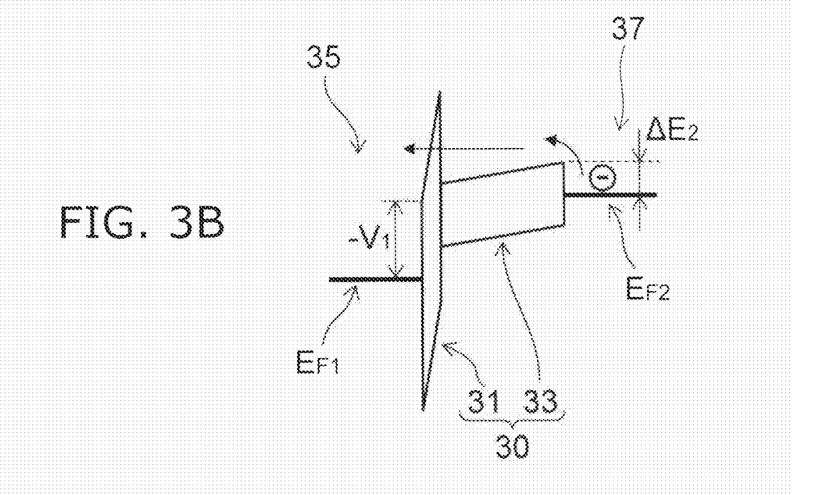
Figure 4:
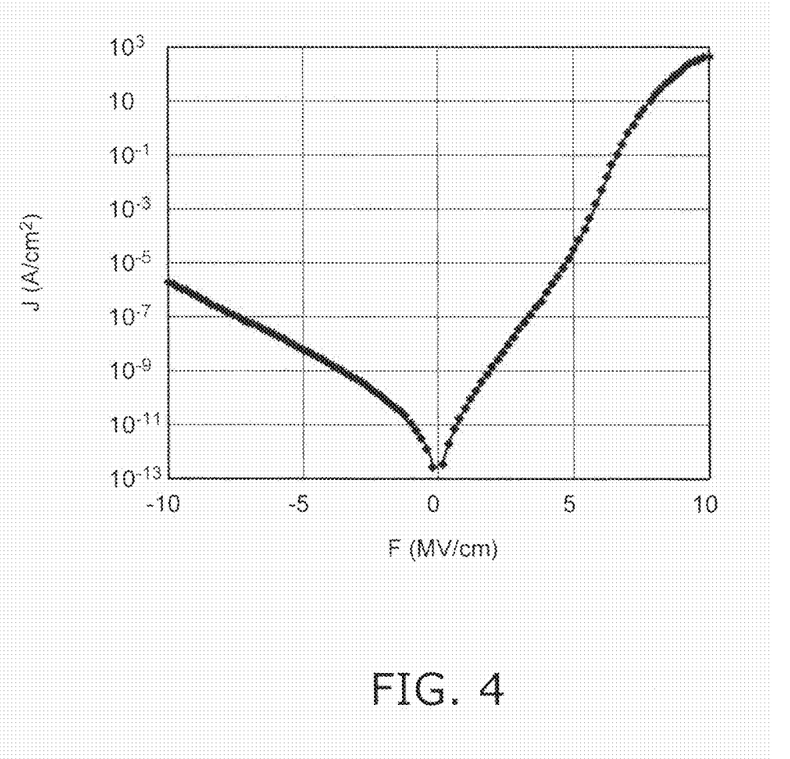
FIG. 4 is an exemplary graph showing a characteristic of the rectifying portion of the non-volatile memory device according to the embodiment.

Next, the rectifying portion 30 will be described with reference to FIGS. 3A, 3B and FIG. 4. FIGS. 3A and 3B are energy band diagrams schematically illustrating the operation of the rectifying portion 30. FIG. 4 is a graph illustrating the characteristics of the rectifying portion 30 according to the embodiment.

In the example shown in FIG. 3A, the rectifying portion 30 includes the first metal oxide layer 31, the second metal oxide layer 33, a first electrode 35, and a second electrode 37. The first electrode 35 is in contact with the first metal oxide layer 31. The second electrode 37 is in contact with the second metal oxide layer 33.

In FIG. 3A, $\Delta E_1$ represents a potential barrier between the first metal oxide layer 31 and the first electrode 35. $\Delta E_2$ represents a potential barrier between the second metal oxide layer 33 and the second electrode 37. $E_{F1}$ represents the Fermi level of first electrode 35. $E_{F2}$ represents the Fermi level of the second electrode 37.

FIG. 3A shows, for example, a case in which a negative potential is applied to the first electrode 35 and a positive potential is applied to the second electrode 37. A voltage $V_1$ corresponding to the difference between $E_{F1}$ and $E_{F2}$ is applied to the rectifying portion 30.

For example, when the dielectric constant of the first metal oxide layer 31 is lower than the dielectric constant of the second metal oxide layer 33, the electric field in the first metal oxide layer 31 is higher than the electric field in the second metal oxide layer 33. Therefore, electrons can be injected into the second metal oxide layer 33 from the first electrode 35 through the first metal oxide layer 31. The electron injected into the second metal oxide layer 33 flows toward the second electrode 37. In this manner, a forward current flows through the rectifying portion 30.

FIG. 3B shows, for example, a case in which a positive potential is applied to the first electrode 35 and a negative potential is applied to the second electrode 37. A voltage $-V_1$ corresponding to the difference between $E_{F1}$ and $E_{F2}$ is applied to the rectifying portion 30. Then, electrons are injected into the second metal oxide layer 33 from the second electrode 37 over the potential barrier $\Delta E_2$. The electron injected into the second metal oxide layer 33 flows toward the first electrode 35 through the first metal oxide layer 33. That is, a backward current flows from the second electrode 37 to the first electrode 35. In this case, only electrons having larger energy than $\Delta E_2$ among the electrons in the second electrode 37 contribute to the backward current. Accordingly, the backward current is suppressed to be smaller than the forward current.

FIG. 4 is a graph illustrating the rectification property in the rectifying portion 30. The horizontal axis represents an electric field value F (MV/cm) in the first metal oxide layer 31. The vertical axis represents a current density J (A/cm$^2$). The data of the electric field value F in a positive area represents a forward current and the data of the electric field value F in a negative area represents a backward current.

The current value flowing through the rectifying portion 30 can be obtained by a simulation. In this example, the first metal oxide layer 31 is a silicon oxide film (SiO$_2$) having a thickness of 1 nanometer (nm). The dielectric constant of the silicon oxide film is set to 3.9 and the potential barrier $\Delta E_1$ is set to 3.7 eV. The second metal oxide layer 33 is tantalum oxide (Ta$_2$O$_5$) having a thickness of 4 nm. The dielectric constant of the tantalum oxide film is set to 21 and the potential barrier $\Delta E_2$ is set to 1.0 eV.

As shown in FIG. 4, the backward current is suppressed to be smaller than the forward current. For example, a ratio of the forward current at the electric field value F of 5 MV/cm to the backward current at the electric field value F of $-5$ MV/cm is about $10^4$.

When detecting an ON current (forward current) flowing through a selected memory cell for reading data in the cross-point memory cell array, it is preferable for an OFF current (backward current) to be smaller than the ON current by one order of magnitude. For example, when the number of memory cells connected to one interconnection is $10^3$, the ON current of one selected cell is compared with the total OFF current that flows through $10^3$ of the unselected cells. Thus, a current ratio of the forward current to the backward current (hereinafter, referred to as an ON/OFF ratio) may be, for example, $10^4$ or more in the rectifying portion 30. That is, when using the rectifying portion 30 having the rectification property shown in FIG. 4, it is possible to connect $10^3$ of memory cells in parallel to one interconnection.

When the ON/OFF ratio of the rectifying portion 30 is increased, the number of memory cells may be increased, which are capable of connecting to one interconnection. That is, when using the rectifying portion 30 having a high ON/OFF ratio, the integration degree of the memory cell is increased, and may reduce the cost of the non-volatile memory device.

Figure 5A:
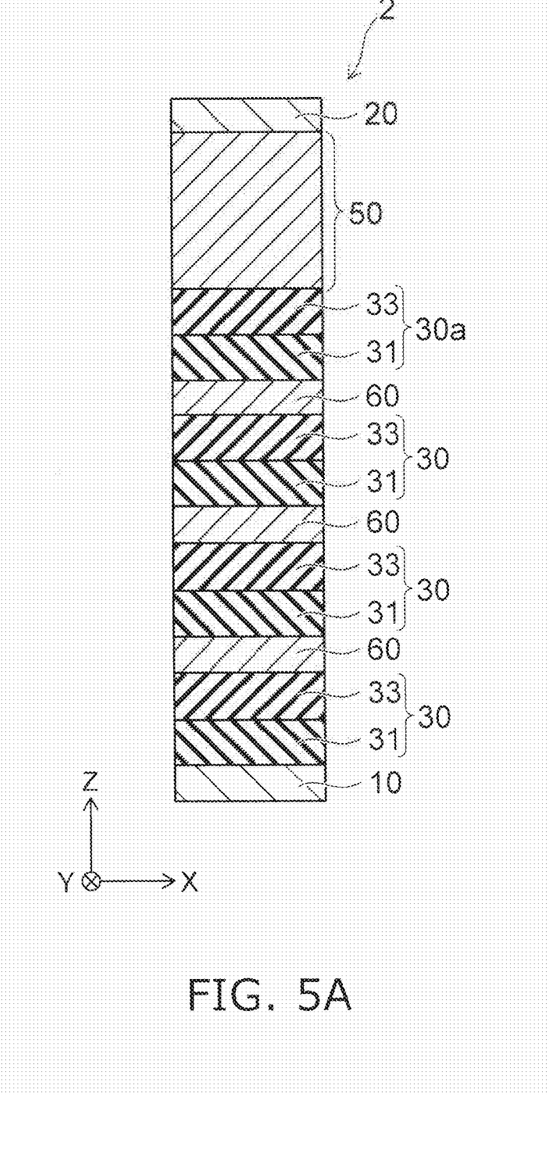
FIGS. 5A and 5B are a schematic cross-sectional view and equivalent circuit showing a memory cell according to a comparative example.
Figure 5B:
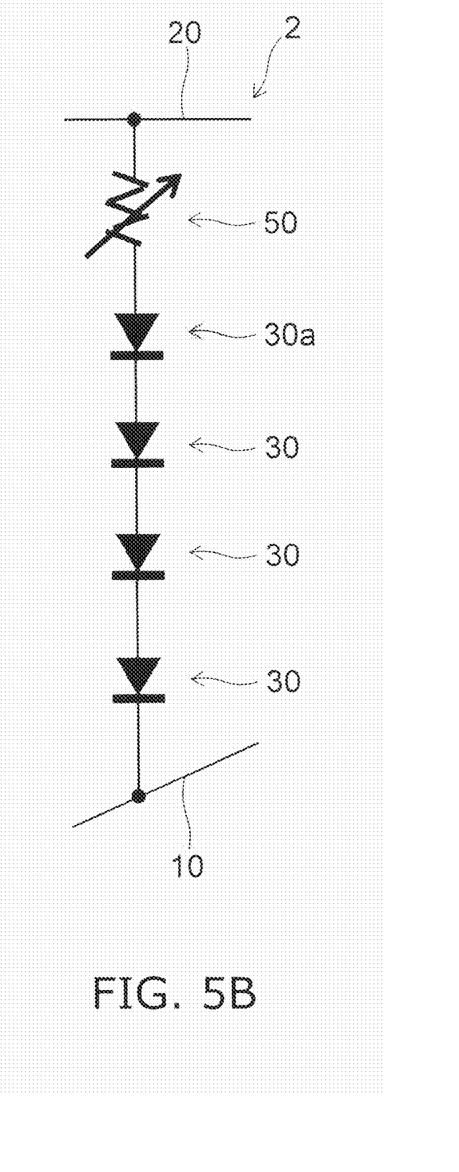

FIGS. 5A and 5B are a schematic cross-sectional view and an equivalent circuit showing a memory cell 2 according to Comparative Example. FIG. 5A is a schematic cross-sectional view showing the memory cell 2. FIG. 5B is an equivalent circuit of the memory cell 2.

The memory cell 2 includes, for example, four rectifying portions 30, and the second resistance change portion 50. The four rectifying portions 30 and the second resistance change portion 50 are arranged in the Z-direction between the first interconnection 10 and the second interconnection 20. The second resistance change portion 50 is disposed between the second interconnection 20 and the rectifying portion 30a. The rectifying portion 30a is positioned at the end on the second interconnection 20 side among the four rectifying portions 30.

The second resistance change portion 50 is formed of the same material as the first resistance change portion 40 and has the same minimum unit structure. That is, the second resistance change portion 50 includes a plurality of first portions 41 arranged in the Z-direction, and at least one second portion 43. The second portion 43 is provided between the first portions 41 adjacent in the Z-direction.

In the example, an electrode layer 60 is provided between the rectifying portions 30 adjacent in the Z-direction since the alternately stacked structure of the first metal oxide layer 31 and the second metal oxide layer 33 without the electrode 60 does not have the rectifying characteristic. The electrode layer 60 is in contact with the rectifying portion 30, and supplies electrons thereto. Thus, the electrodes 60 give the rectifying characteristic to the stacked structure of the first metal oxide layer 31 and the second metal oxide layer 33.

As shown in FIG. 5B, the four rectifying portions 30 and the second resistance change portion 50 are connected in series between the first interconnection 10 and the second interconnection 20. In the memory cell 2 having such a structure, the rectifying portions 30 connected in series increase the ON/OFF ratio thereof.

Figure 6:
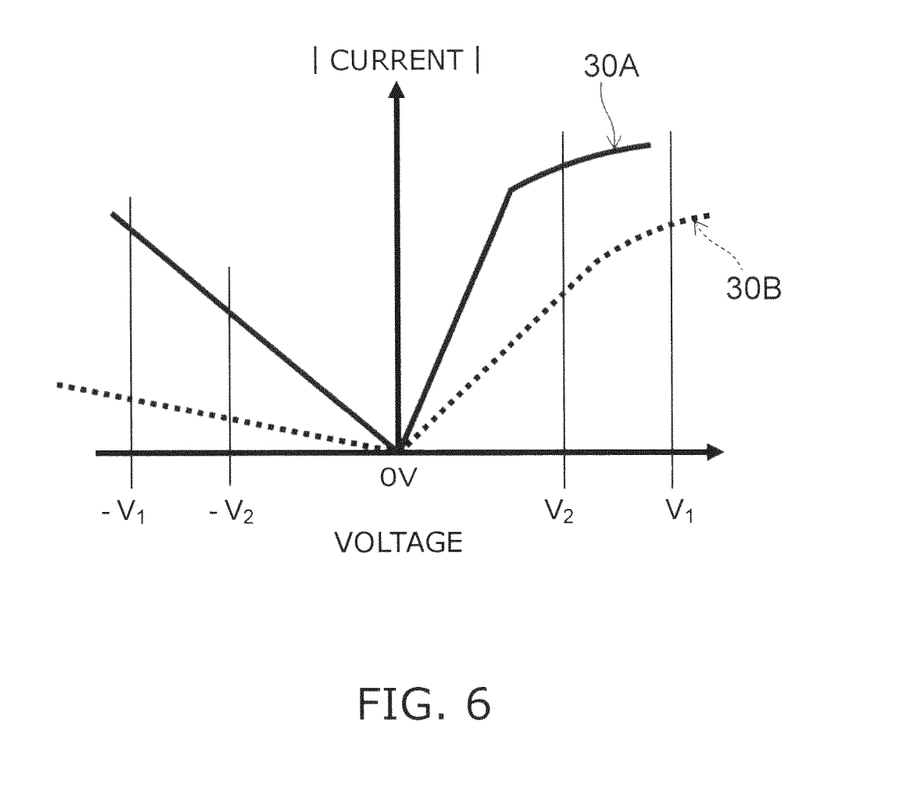
FIG. 6 is an exemplary view schematically showing another characteristic of the rectifying portion according to the embodiment.

FIG. 6 is a schematic view illustrating the current-voltage characteristics of the rectifying portion 30. The vertical axis represents an absolute value of a current and the horizontal axis represents a voltage. A forward current is shown in a positive voltage area and a backward current is shown in a negative voltage area.

FIG. 6 shows the current-voltage characteristics of two rectifying portions 30A and 30B. The rectifying portion 30A has thickness in the Z-direction thinner than a thickness in the Z-direction of the rectifying portion 30B.

For example, it may be preferable to make the forward current of the rectifying portion 30 larger in order to cause a phase change in the second resistance change portion 50. As shown in FIG. 6, the thickness of the rectifying portion 30 in the Z-direction may be preferably decreased to increase the forward current thereof. When the thickness of the rectifying portion 30 in the Z-direction is decreased, however, the backward current is also increased. It may be found in FIG. 6 that a method of lowering the operating voltage from ±V1 to ±V2, for example, may be advantageously used to suppress the backward current while maintaining the increased level of the forward current.

For example, when operating the memory cell 2, a first predetermined voltage is applied thereto, and the second resistance change portion 50 is operated under a second predetermined voltage less than the first predetermined voltage. Thus, the voltage applied to the rectifying portions 30 connected in series is constant. In the memory cell 2, the number of rectifying portions 30 is optimized so that the voltage applied to each of the rectifying portions 30 is adjusted to maximize the ON/OFF ratio.

In the memory cell 2, however, it is necessary for the respective rectifying portions 30 to be in contact with the electrode layers 60. Accordingly, the number of electrode layers 60 is increased in proportion to the number of rectifying portions 30. Thus, it may be difficult to reduce the size in the Z-direction in the memory cell 2, increasing the difficulty in the miniaturization of the memory cell 2. As a result, the manufacturing yield of the memory cell 2 is predicted to be lowered, and increases the manufacturing cost thereof.

In contrast, in the memory cell 1 shown in FIG. 1A, the first resistance change portion 40 is provided between the rectifying portions 30 adjacent in the Z-direction. The first portion 41 included in the first resistance change portion 40 is in contact with the first metal oxide layer 31 and the second metal oxide layer 33, thereby replacing the electrode layer 60. That is, the first resistance change portion 40 acts in the memory cell 1 as both a data memory layer and an electrode of the rectifying portion 30.

The memory cell 1 includes the four rectifying portions 30, the first resistance change portion 40, and the second resistance change portion 50. For example, when a total thickness in the Z-direction of the first resistance change portion 40 and the second resistance change portion 50 included in the memory cell 1 is the same as the thickness in the Z-direction of the second resistance change portion 50 included in the memory cell 2, the both memory cells may exhibit the same memory characteristics. On the other hand, the size in the Z-direction of the memory cell 1 is smaller than the size in the Z-direction of the memory cell 2 by a total thickness of the electrode layers 60. In this manner, the size of the memory cell 1 may be decreased to be smaller than the size of the memory cell 2. Thus, the memory cell 1 can be advantageously miniaturized.

Next, memory cells 3 to 6 according to variations of the embodiment will be described with reference to FIGS. 7A to 8B. FIGS. 7A to 8B are schematic cross-sectional views showing the memory cells 3 to 6.

Figure 7A:
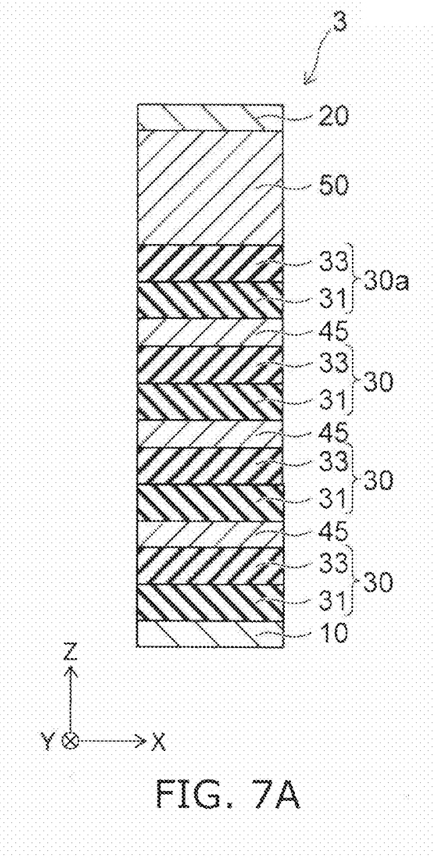

A memory cell 3 shown in FIG. 7A includes four rectifying portions 30, a plurality of first resistance change portions 45, and the second resistance change portion 50 between the first interconnection 10 and the second interconnection 20. The four rectifying portions 30 are arranged in the Z-direction. Each of the first resistance change portions 45 is provided between the rectifying portions 30 adjacent in the Z-direction. The second resistance change portion 50 is provided between the second interconnection 20 and the rectifying portion 30a. The rectifying portion 30a is positioned at an end of the four rectifying portions 30 on the second interconnection side.

For example, titanium nitride (TiN) may be used for the first interconnection 10 and the second interconnection 20. The first interconnection 10 is in contact with, for example, the first metal oxide layer 31, and serves as an electrode of the rectifying portion 30. The second interconnection 20 is in contact with, for example, the first portion 41 of the second resistance change portion 50.

For example, the first resistance change portion 45 includes the minimum unit of the phase change structure. That is, the first resistance change portion 45 includes two first portions 41 and the second portion 43 provided therebetween. The second resistance change portion 50 includes a plurality of second portions 43, and the thickness thereof in the Z-direction is thicker than the thickness of the first resistance change portion 45 in the Z-direction. In addition, the first resistance change portion 45 and the second resistance change portion 50 are provided so that the whole second portions 43 included therein provide the resistance change amount that is suitable for data storage.

For example, when a preferable number of rectifying portions 30 is the same as a total number of second portions 43 to be included in both the first resistance change portion 45 and the second resistance change portion 50, the second resistance change portion 50 may also be formed to be the minimum unit of the phase change structure. That is, the thickness of the first resistance change portion 45 in the Z-direction may be the same as the thickness of the second resistance change portion 50 in the Z-direction.

When the total number of second portions 43 included in the first resistance change portion 45 and the second resistance change portion 50 is larger than the preferable number of rectifying portions 30, for example, the second resistance change portion 50 is formed to include the second portions 43 of 2 or more.

Figure 7B:
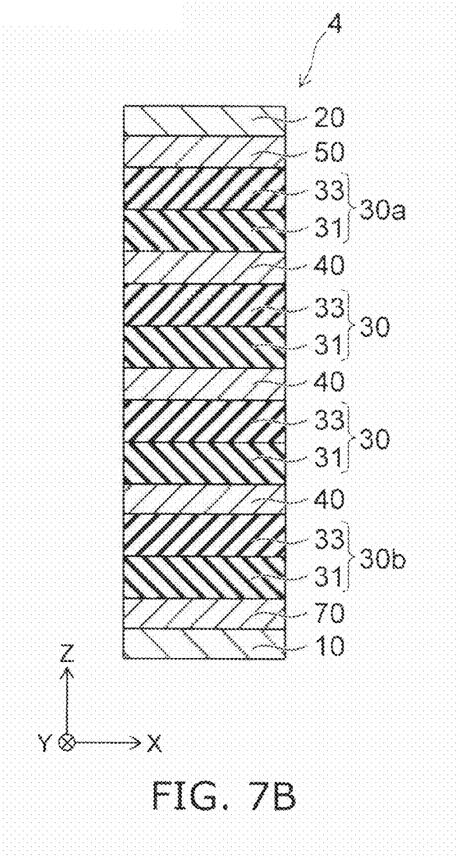

A memory cell 4 shown in FIG. 7B further includes a third resistance change portion 70. The third resistance change portion 70 is provided between the first interconnection 10 and a rectifying portion 30b. The rectifying portion 30b is positioned at an end of the four rectifying portions 30 arranged in the Z-direction on the first interconnection 10 side. The third resistance change portion 70 includes a plurality of first portions 41 arranged in the Z-direction and the second portion 43 provided between the first portions 41 adjacent in the Z-direction.

As shown in FIG. 7B, the memory cell 4 includes the first resistance change portions 40, the second resistance change portion 50, and the third resistance change portion 70. Each of the first resistance change portion 40, the second resistance change portion 50 and the third resistance change portion 70 has an arbitrary thickness in the Z-direction. A total thickness in the Z-direction of the first resistance change portion 40, the second resistance change portion 50, and the third resistance change portion 70 is provided to include an enough number of second portions 43 to induce an amount of the resistance change that is suitable for data storage.

Figure 7C:
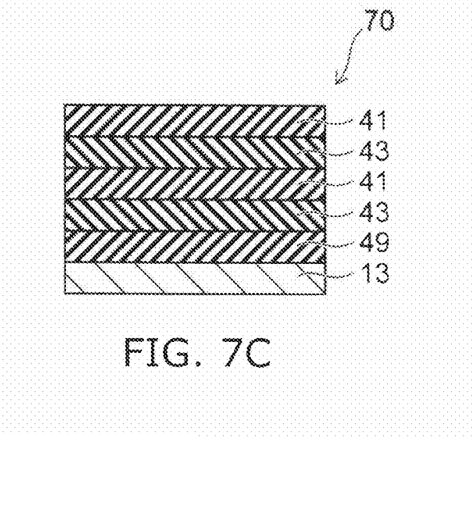

FIG. 7C is a schematic cross-sectional view showing the third resistance change portion 70. The third resistance change portion 70 is deposited on the first interconnection 10 by using ALD, for example. The first interconnection 10 has a surface layer 13 having a thickness of 3 nm, and is formed of titanium nitride (TiN) or titanium (Ti), for example.

As shown in FIG. 7C, for example, a first portion 49 is formed on the surface layer 13. The first portion 49 is a $Sb_2Te_3$ layer having a thickness of 5 nm, which serves as, for example, a seed layer. Subsequently, the second portion 43 is formed on the first portion 49. The second portion 43 is, for example, a GeTe layer having a thickness of 1 nm. Further, the first portion 41 is formed on the second portion 43. The first portion 41 is, for example, a $Sb_2Te_3$ layer having a thickness of 4 nm. Then, the second portion 43 and the first portion 41 are alternately formed, and thus the third resistance change portion 70 is formed to include a predetermined number of second portions 43.

The second interconnection 20 is in contact with the second resistance change portion 50. The second interconnection 20 is formed of titanium nitride, for example, and the portion in contact with the first portion 41 of the second resistance change portion 50 may include a titanium layer.

For example, when the contact resistance is large between the first interconnection 10 and the rectifying portion 30b, and between the second interconnection 20 and the rectifying portion 30a, it may be possible to reduce the contact resistance by providing the third resistance change portion 70 and the second resistance change portion 50 to be interposed between the first interconnection 10 and the rectifying portion 30b and between the second interconnection 20 and the rectifying portion 30a, respectively. In addition, the phase shift of the resistance change portion 40 between the first state and the second state may be facilitated by heat generation in the rectifying portion 30.

As described above, for example, the memory cell according to the embodiment comprises an enough number of rectifying portions 30 to increase the ON/OFF ratio by dividing the voltage to be applied between the first interconnection 10 and the second interconnection 20. The first resistance change portion 40 is provided between the rectifying portions 30 adjacent in the Z-direction. Further, the second resistance change portion 50 may be provided between the second interconnection 20 and the rectifying portion 30 adjacent to the second interconnection 20, and the third resistance change portion 70 may be provided between the first interconnection and the rectifying portion 30 adjacent to the first interconnection 10.

The number of second portions 43 is arbitrary in the first resistance change portion 40, the second resistance change portion 50, and the third resistance change portion 70, respectively. Further, the number of second portions 43 may be different in each of the first resistance change portions 40.

In the embodiment, the phase change material is described as an example, in which the first portion 41 ($Sb_2Te_3$) and the second portion 43 (GeTe) are alternately stacked, but the embodiment is not limited thereto. Other chalcogenide compounds, for example, combinations of $Sb_xTe_y$ and $Sn_xTe_y$, $Sb_xTe_y$ and $Si_xTe_y$, $Sb_xTe_y$ and $Al_xTe_y$, $Sb_xTe_y$ and $Cu_xTe_y$, and the like, may be used. Further, a chalcogenide compound may be used in which Te is substituted with selenium (Se), such as a combination of $Sb_xSe_y$ and $Ge_xSe_y$. The thickness of the first portion 41 in the Z-direction is preferably in a range of 1 nm or more to 20 nm or less in view of reducing the cell thickness. In addition, the thickness of the second portion 43 in the Z-direction is preferably 5 nm or less.

In the above-described embodiment, the arrangement of the first metal oxide layer 31 and the second metal oxide layer 33 may be reversed. In other words, the first interconnection 10 and the second interconnection 20 may be interchanged.

Figure 8A:
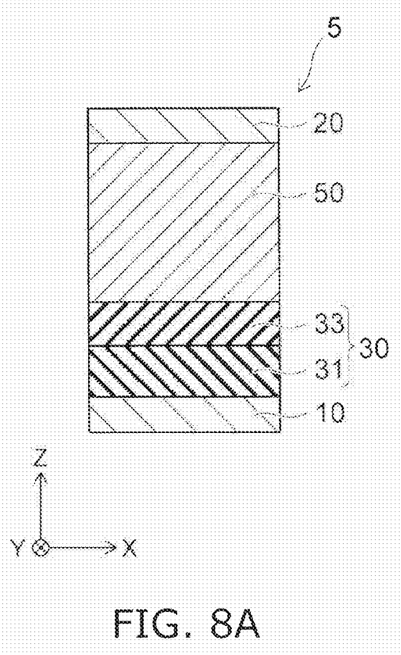

A memory cell 5 shown in FIG. 8A includes one rectifying portion 30 and the second resistance change portion 50 between the first interconnection 10 and the second interconnection 20. The first metal oxide layer 31 of the rectifying portion 30 is in contact with the first interconnection 10. The second metal oxide layer 33 is in contact with the first portion 41 of the second resistance change portion 50. In addition, the second interconnection 20 is in contact with the first portion 41 on a side of the second resistance change portion 50 opposite to the rectifying portion 30.

The first portion 41 of the second resistance change portion 50 serves as one of electrodes of the rectifying portion 30. Accordingly, the electrode layer that supplies electrons to the rectifying portion 30 can be omitted, and the size of the memory cell 5 in the Z-direction can be reduced. In this manner, in a case where one rectifying portion 30 is provided, the electrode thereof can be omitted, and thus, the memory cell size is reduced, thereby improving the integration degree of the cross-point memory array.

Figure 8B:
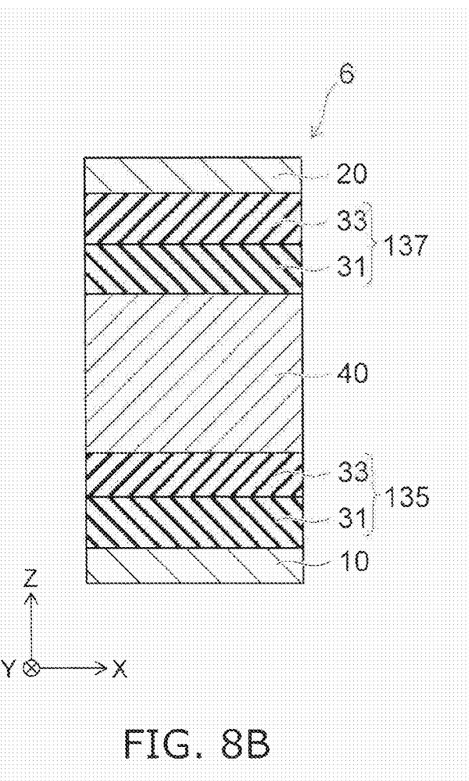

A memory cell 6 shown in FIG. 8B includes a first rectifying portion 135, a second rectifying portion 137, and the first resistance change portion 40 between the first interconnection 10 and the second interconnection 20. The first metal oxide layer 31 of the first rectifying portion 135 is in contact with the first interconnection 10. The second interconnection 20 is in contact with the second metal oxide layer 33 of the second rectifying portion 137.

The first resistance change portion 40 is provided between the first rectifying portion 135 and the second rectifying portion 137. The second metal oxide layer 33 of the first rectifying portion 135 is in contact with the first portion 41 of the first resistance change portion 40. The first metal oxide layer 31 of the second rectifying portion 137 is in contact with the first portion 41 of the first resistance change portion 40.

In this example, the first portion 41 of the first resistance change portion 40 serves as each electrode of the first rectifying portion 135 and the second rectifying portion 137. Accordingly, the electrode layer that supplies electrons to the first rectifying portion 135 and the second rectifying portion 137 can be omitted, and the size of the memory cell 6 in the Z-direction can be reduced. Thus, the integration degree of the cross-point memory cell may be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
   a first interconnection;
   a second interconnection closest to the first interconnection in a first direction;
   a first rectifying portion disposed between the first interconnection and the second interconnection, the first rectifying portion including a first metal oxide layer and a second metal oxide layer stacked in the first direction;

a second rectifying portion provided between the first rectifying portion and the second interconnection, the second rectifying portion including another first metal oxide layer and another second metal oxide layer stacked in the first direction; and a first resistance change portion disposed between the first rectifying portion and the second rectifying portion; and a second resistance change portion disposed between the second interconnection and the second rectifying portion, the first metal oxide layer and the another second metal oxide layer being in contact with the first resistance change portion.

2. The device according to claim 1, wherein an energy band gap of the first metal oxide layer is larger than an energy band gap of the second metal oxide layer.

3. The device according to claim 2, wherein a thickness of the first metal oxide layer in the first direction is thinner than a thickness of the second metal oxide layer in the first direction.

4. The device according to claim 2, wherein a dielectric constant of the second metal oxide layer is higher than a dielectric constant of the first metal oxide layer.

5. The device according to claim 1, wherein the first resistance change portion has a plurality of first portions arranged in the first direction and a second portion provided between adjacent ones of the plurality of first portions in the first direction, and a first portion positioned at an end of the arrangement of the plurality of first portions is brought into contact with one of the first metal oxide layer and the second metal oxide layer.

6. The device according to claim 5, wherein each of the plurality of first portions has a higher conductivity than the second portion.

7. The device according to claim 5, wherein each of the plurality of first portions contains antimony and tellurium, and the second portion contains germanium and tellurium.

8. The device according to claim 7, wherein the first resistance change portion is reversibly shifted between a first state and a second state having lower electric resistance than that of the first state, wherein the geranium has a valency of 4 in the first state, and a valency of 6 in the second state.

9. The device according to claim 8, wherein the first resistance change portion in the second state has atomic planes in the second portion that face each other without interatomic bonding.

10. The device according to claim 5, wherein the first portion contains a chalcogenide compound with a hexagonal crystal structure and the second portion contains a chalcogenide compound with a cubic crystal structure.

11. The device according to claim 1, wherein the second resistance change portion has a plurality of first portions arranged in the first direction and a second portion disposed between adjacent ones of the plurality of first portions in the first direction, and the plurality of first portions contain a chalcogenide compound with a hexagonal crystal structure, and the second portion contains a chalcogenide compound with a cubic crystal structure.

12. The device according to claim 11, wherein the second interconnection is in contact with a first portion of the second resistance change portion that is positioned at an end of the plurality of first portions opposite to the second rectifying portion, and the second interconnection contains titanium nitride or titanium in a contact portion in contact with the first portion of the second resistance change portion.

13. The device according to claim 1, further comprising a third resistance change portion disposed between the first interconnection and the first rectifying portion.

14. The device according to claim 13, wherein the third resistance change portion has a plurality of first portions arranged in the first direction and a second portion disposed between adjacent ones of the plurality of first portions in the first direction, and the plurality of first portions contain a chalcogenide compound with a hexagonal crystal structure, and the second portion contains a chalcogenide compound with a cubic crystal structure.

15. The device according to claim 14, wherein the first interconnection is in contact with a first portion of the third resistance change portion that is positioned at an end of the plurality of first portions opposite to the first rectifying portion, and the first interconnection contains titanium nitride or titanium in a contact portion in contact with the first portion of the third resistance change portion.

16. The device according to claim 1, wherein the first resistance change portion has a plurality of first portions arranged in the first direction and a second portion disposed between adjacent ones of the plurality of first portions in the first direction, the plurality of first portions containing a chalcogenide compound with a hexagonal crystal structure, and the second portion containing a chalcogenide compound with a cubic crystal structure;

a first portion positioned at an end of the plurality of first portions on the first interconnection side is in contact with the first rectifying portion; and a first portion positioned at another end of the plurality of first portions on the second interconnection side is in contact with the second rectifying portion.

17. A non-volatile memory device comprising:
a first interconnection;
a second interconnection closest in a first direction to the first interconnection;
a rectifying portion provided between the first interconnection and the second interconnection, the rectifying portion including a first metal oxide layer and a second metal oxide layer stacked on the first metal oxide layer in the first direction;
a first resistance change portion provided between the rectifying portion and the first interconnection, the resistance change portion including a plurality of first portions arranged in the first direction and a second portion arranged between adjacent ones of the plurality of first portions in the first direction; and
a second resistance change portion provided between the rectifying portion and the second interconnection,
wherein the plurality of first portions contain a chalcogenide compound with a hexagonal crystal structure, and the second portion contains a chalcogenide compound with a cubic crystal structure, and a first portion positioned at an end of the plurality of first portions on the rectifying portion side is in contact with one of the first metal oxide layer and the second metal oxide layer.

18. The device according to claim 17, wherein
an energy gap of the first metal oxide layer is wider than an energy gap of the second metal oxide layer, and
a thickness of the first metal oxide layer in the first direction is thinner than a thickness of the second metal oxide layer in the first direction.

\* \* \* \* \*